United States Patent [19]

Blinchikoff

[11] 4,060,776
[45] Nov. 29, 1977

[54] INTERMEDIATE-BAND CRYSTAL FILTER WITH LOW-TRANSIENT RESPONSE

[75] Inventor: Herman J. Blinchikoff, Baltimore, Md.

[73] Assignee: Westinghouse Electric Corporation, Pittsburgh, Pa.

[21] Appl. No.: 687,138

[22] Filed: May 17, 1976

[51] Int. Cl.² ........................ H03H 7/04; H03H 7/08
[52] U.S. Cl. ................................. 333/72; 333/74; 333/78
[58] Field of Search ............... 333/72, 71, 74, 70 R, 333/77–78; 310/8.1, 8.2

[56] References Cited

U.S. PATENT DOCUMENTS

| | | | |
|---|---|---|---|
| 2,212,840 | 8/1940 | Mason | 333/72 |
| 3,344,369 | 9/1967 | Bies et al. | 333/72 |

OTHER PUBLICATIONS

Herzog — "Circuits Conditionally Equivalent to a Lattice Circuit," in Proc. IREE, Australia, July 1966; pp. 180–189.

Pond — "Phased Matched Crystal Filters," Conference 1970 Wescon Technical Papers, vol. III, Western Electronic Show and Convention, Los Angeles, Calif. (25–28 Aug. 1970); pp. 1–6.

Primary Examiner—Alfred E. Smith
Assistant Examiner—Marvin Nussbaum
Attorney, Agent, or Firm—H. W. Patterson

[57] ABSTRACT

An intermediate-band, low-transient crystal filter utilizing standard components. The filter is characterized by improved response and temperature stability and a size which is smaller than presently used LC filters, helical filters and wide-band crystal filters. This is achieved by an unusual partitioning of a low-pass prototype ladder network which yields a cascade of symmetric lattice sections and, hence, a realizable crystal filter. The cascade is composed of only two fundamental sections.

4 Claims, 5 Drawing Figures

INTERMEDIATE-BAND CRYSTAL FILTER WITH LOW-TRANSIENT RESPONSE

GOVERNMENT CONTRACT

The invention herein described was made in the course of or under a contract or subcontract thereunder with the Department of the Air Force.

BACKGROUND OF THE INVENTION

As is known, radar and communication systems often employ signal processing arrangements which require very narrow-band filters with low-transient responses. Crystal filters, because of their low insertion loss, good temperature stability and small size are ideal for these applications; however certain classes of responses have not been realizable in this manner. Bandpass crystal filters are usually divided into three classes, narrow-band having bandwidths less than 0.2%; intermediate-band having bandwidths between 0.2% and 1%; and wide-band having bandwidths greater than 1%. No practical realization has heretofore existed for intermediate-band crystal filters with low-transient responses.

It is known that an intermediate-band crystal filter response is realizable if it can be simulated by a lattice network or a cascade of lattice networks containing only series resonant circuits to simulate crystal resonances. Intermediate-band filters derived from symmetric or anti-metric low-pass networks can always be realized as a complicated lattice network. Thus, the prototype low-pass ladder network can first be transformed into a lattice network and then transformed to a band-pass crystal filter. Unfortunately, the low-transient prototype networks are neither symmetric nor anti-metric, accounting for the absence of any previous teaching of techniques for realizing intermediate-band, low-transient filters.

At the present time, low-transient responses are achieved by wide-band crystal filters, helical filters or possibly LC filters. However, these approaches have several disadvantages. First, wide-band crystal filters incorporate inductances as an integral resonating component of the filter rather than a transforming device. Consequently, the inductance Q requirement is high and usually necessitates ferrite as a core material. The filter response does not remain within the required limits over the military temperature range of $-55°$ C to $+95°$ C because it is very difficult to find a ferrite material possessing suitable linear temperature characteristics over this wide temperature range. Thus, suitable compensation with polystyrene capacitors is impossible over the entire range. If powdered iron is used as the core material, the necessary Q is obtained at the expense of increased size. In addition, temperature compensation is then accomplished only by "hand-picking" the temperature compensating capacitors. Furthermore, the element values become impractical at the lower end of the intermediate band.

A second disadvantage resides in the fact that for narrow bandwidths, helical filters are relatively large; their insertion loss is appreciable; and, moreover, the insertion loss varies with temperature. This latter feature is extremely undesirable and compensation is employed to remedy the situation. For such applications, therefore, helical filters are only a marginal solution.

LC filters are rarely used to achieve intermediate-band low-transient responses and then only for the wider bandwidths (e.g., 1%). Again, the Q requirement is prohibitive and the insertion loss is too high. This, in turn, increases the filter's size.

SUMMARY OF THE INVENTION

In accordance with the present invention, an intermediate-band, low-transient crystal filter is provided which does not have the disadvantages of wide-band crystal filters, helical filters, and LC filters. The filter of the invention is realized by an unusual partitioning of the low-pass prototype ladder network and by the use of constant reactance elements, an artifice which allows the filter to be realized as a cascade of symmetric lattice sections. The cascade is composed of only two fundamental sections. These sections are then converted to the well-known half-lattice sections, thereby halving the number of lattice network components required.

More specifically, a technique is provided for realizing low-transient intermediate-band crystal filters which starts with tabulated values of the low-pass prototype network. Insertion of constant reactance elements allows the low-pass network to be partitioned to realize the filter as a cascade of lattice sections. This cascade, using only two fundamental lattice sections, is then converted to semi-lattice sections to halve the number of crystals. This method is not restricted to only low-transient, low-pass prototypes, but may include other low-pass filters not heretofore transformable to intermediate-band crystal filters realized as a cascade of lattice sections. This includes responses derived from symmetric or anti-metric low-pass networks which are presently realized as one lattice section.

BRIEF DESCRIPTION OF THE DRAWINGS

The above and other objects and features of the invention will become apparent from the following detailed description, taken in connection with the accompanying drawings which form a part of this specification, and in which.

DESCRIPTION OF THE PREFERRED EMBODIMENT

Figure 1:
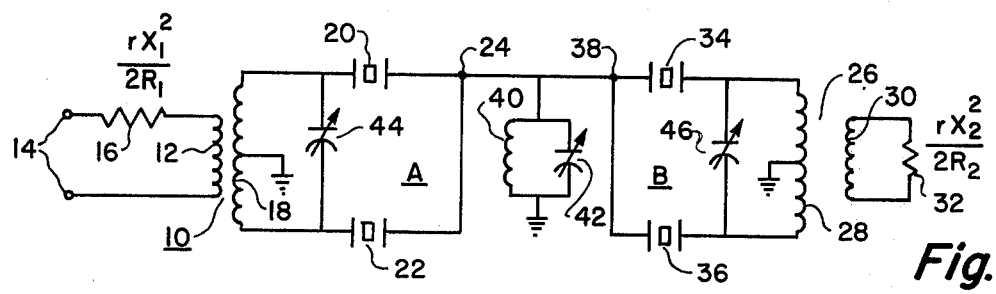
FIG. 1 is a schematic circuit diagram of one embodiment of the invention.

With reference now to the drawings, and particularly to FIG. 1, an illustrative embodiment of the invention is shown in a low-transient intermediate-band filter. The filter shown includes an input transformer 10 provided with a primary winding 12 connected to input terminals 14 through resistor 16. The secondary winding 18 of the transformer 10 has its midpoint connected to ground as shown.

The filter network is comprised of two sections identified as A and B. Each section includes two crystals. For example, section A includes crystals 20 and 22. One side of each of the crystals 20 and 22 is connected to a respective end of the secondary winding 18; while the other sides of the crystals are interconnected as at 24.

Similarly, the output lattice section B includes an output transformer 26 having a primary winding 28 provided with a grounded center tap and a secondary winding 30 connected to a load resistor 32. Opposite ends of the primary winding 28 are connected at one side of each of two crystals 34 and 36, the other sides of the crystals being interconnected as at 38. The points of interconnection 24 and 38, are connected through the parallel combination of inductor 40 and variable capacitor 42 to ground and, hence, back to the mid taps on the windings 18 and 28. Variable capacitors 44 and 46 are connected in shunt with the respective windings 18 and 28. The resulting configuration provides an intermediate-band, low transient response crystal filter.

The manner in which the filter of FIG. 1 is derived is shown in FIGS. 2 to 5, and illustrates the general method of the present invention. As previously indicated, this involves an unusual partitioning of a prototype low-pass ladder network with the use of constant reactance elements. This allows the filter to be realized as a cascade of simple lattice sections which are then converted to half-lattice sections. It will be apparent that this technique is not restricted to only low-transient, low-pass prototypes but may be applied to other low-pass filters not previously transformable to intermediate-band crystal filters.

The technique is illustrated in the drawing by the derivation of the above-described intermediate-band crystal filters. A prototype third-order, low-transient, low-pass ladder filter is partitioned into symmetric sections and the band pass crystal lattice equivalent of each section is derived. Specific values of the network elements may be obtained from Zverev, *Handbook of Filter Synthesis,* John Wiley & Sons, New York, 1967, or other standard text. These constant reactance values are inserted to give the equivalent network of FIG. 2, partitioned as shown in section A and section B. The sections must each be symmetric if the lattice equivalent is to be obtained, and filters of any order can thus be partitioned into symmetric sections. This partitioning of a third-order filter with the use of constant reactances results in the network of FIG. 2 in which the sections A and B are symmetric if $C_1 X_1^2 = L_2/2$ and $C_3 X_2^2 = L_2/2$, or $X_1^2 = L_2/2C_1$ and $X_2^2 = L_2/2C_3$.

Figure 2:
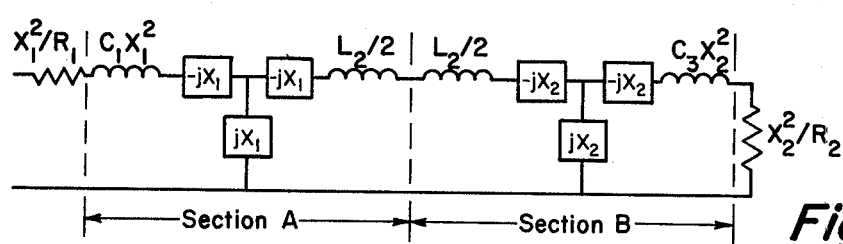
FIGS. 2–5 are diagrammatic illustrations showing the manner in which the filter of the invention is synthetized.
Figure 3:
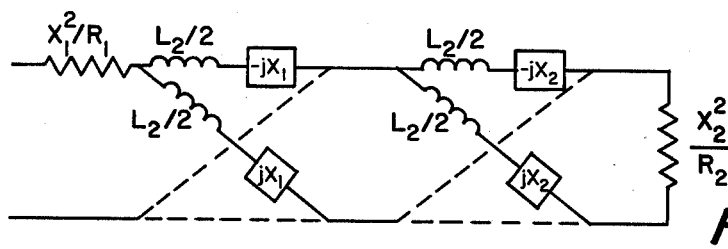
Figure 4:
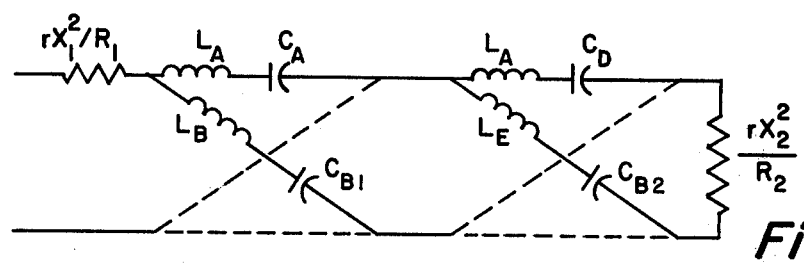

The equivalent lattice sections shown in FIG. 3 are then obtained using Bartlett's Theorem. This is a well-known rule to the effect that if a ladder network is symmetrically partitioned, as described above, an equivalent lattice network can be obtained by bisecting the ladder network section and using the short-circuit impedance of the half-section as the series arms of the lattice while the open-circuit impedances are used as the diagonal arms. See, for example, page 546 of the aforesaid *Handbook of Filter Synthesis.* The standard low-pass to band-pass frequency transformation is then applied to obtain the bandpass filter with center frequency $\omega_o$ and 3 db bandwidth $\Delta\omega$. The constant reactances are unaffected by this transformation and any distortion is negligible at the relative bandwidths involved. The network is impedance scaled by $r$, and the constant reactances $X_1$ and $X_2$ of FIG. 2 are then realized as the corresponding inductors and capacitors $C_1$, $L_1$ and $C_{II}$, $L_{II}$, as follows;

$-jX_1 \quad C_1 = \dfrac{1}{\omega_o r X_1}$ (1)

$jX_1 \quad L_1 = \dfrac{X_1}{\omega_o r}$ (2)

$-jX_2 \quad C_{II} = \dfrac{1}{\omega_o r X_2}$ (3)

$jX_2 \quad L_{II} = \dfrac{X_2}{\omega_o r}$ (4)

Like elements can then be combined to yield a lattice network with an LC series circuit in each arm. This results in the network of FIG. 4 with the following element values:

$$L_A = L_B = L_E = \dfrac{rL_2}{2\Delta\omega}$$

$$C_A = \dfrac{\gamma}{r\omega_o(\dfrac{L_2}{2} + \gamma X_1)} \text{ where } \gamma = \dfrac{\Delta\omega}{\omega_o}$$

$$C_{B1} = \dfrac{4\gamma(\dfrac{L_2}{2} + \gamma X_1)}{r\omega_o L_2^2}$$

$$C_D = \dfrac{\gamma}{r\omega_o(\dfrac{L_2}{2} + \gamma X_2)}$$

$$C_{B2} = \dfrac{4\gamma(\dfrac{L_2}{2} + \gamma X_2)}{r\omega_o^2 L_2^2}$$

Inductance values are set equal to ease crystal manufacture, however, the proper series resonant frequency is retained.

Figure 5:
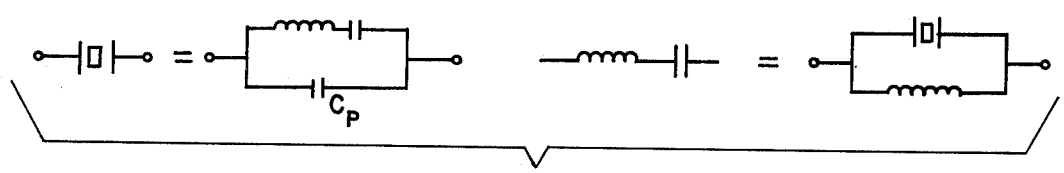

The crystals to be used in the final filter circuit have the first-order equivalent circuit shown at the left in FIG. 5, where $C_P$ represents the pin-to-pin and case capacitance. The effect of this capacitance can be removed for these relatively narrow bandwidths by resonating $C_P$ with a parallel inductance, giving the equivalence shown at the right of FIG. 5. Use of the semi-lattice network (see the above-cited *Handbook of Filter Synthesis,* page 424) then yields the final filter circuit of FIG. 1 with four crystals. In this circuit the parallel inductances have been removed and incorporated in the transformers and the shunt coil. The variable capacitors are necessary because the winding capacitance is not precisely known and some stray capacitance is unavoidably present. The variable capacitors 44 and 46 permit compensation of these effects.

It will be apparent that the technique described is generally applicable to deriving intermediate-band crystal filters with low-transient response, or other desired responses which have not heretofore been realizable. Such filters have superior temperature characteristics to the wide-band crystal filters previously used, and have lower insertion losses and smaller size than other types of filters.

What is claimed is:

1. An intermediate-band crystal filter comprising at least one pair of lattice filter sections, one of said sections including an input transformer winding and a first pair of crystals connected to each other and to opposite ends of the input transformer winding, the other of said sections including an output transformer winding and a second pair of crystals connected to each other and to opposite ends of the output transformer winding, said sections being directly connected together at the junctions between the crystals of each pair of crystals, and said junctions being connected by a parallel-connected inductor and capacitor to the midpoints of said input and output transformer windings, each of said filter sections comprising a semi-lattice equivalent to a lattice network derived from a prototype low-pass ladder network, and said inductor and capacitor being common to both filter sections.

2. A crystal filter as defined in claim 1 in which the values of said inductor and capacitor are the resultants of combining like elements of both filter sections.

3. A crystal filter as defined in claim 1 and including a capacitor connected across each of said transformer windings.

4. A crystal filter as defined in claim 3 in which said capacitors are variable.

* * * * *